United States Patent
Batchelder

(10) Patent No.: US 6,483,081 B1
(45) Date of Patent: Nov. 19, 2002

(54) IN-LINE CURE FURNACE AND METHOD FOR USING THE SAME

(75) Inventor: William Tom Batchelder, Oakland, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/723,624

(22) Filed: Nov. 27, 2000

(51) Int. Cl.⁷ .................................................. F27B 5/14
(52) U.S. Cl. ........................ 219/390; 219/485; 219/411; 118/724; 118/50.1; 392/416
(58) Field of Search ................................. 219/390, 405, 219/411; 118/724, 725, 50.1; 392/416, 418

(56) References Cited

U.S. PATENT DOCUMENTS

| | | | | |
|---|---|---|---|---|
| 5,001,327 A | * | 3/1991 | Hirasawa et al. | 219/390 |
| 5,232,506 A | * | 8/1993 | Kawase | 118/719 |
| 5,443,648 A | * | 8/1995 | Ohkase | 118/724 |
| 6,193,507 B1 | * | 2/2001 | White et al. | 432/247 |

* cited by examiner

Primary Examiner—Teresa Walberg
Assistant Examiner—Shawntina Fuqua
(74) Attorney, Agent, or Firm—Martine & Penilla, LLP

(57) ABSTRACT

A system and method for thermal curing of substrates are provided. In one example, a pair of vertical furnace tubes are configured with a hot plate positioned between the lower regions of the furnace tubes and connected to each tube by a passageway. A cooling chamber is positioned between the furnace tubes in an upper region and connected to both tubes by an upper passageway. A wafer transport is configured within each furnace tube to transition wafers from the lower region of each tube, through a middle region of each tube, and to the upper region of each tube. A method is provided in which substrates are pre-heated on the hot plate and then transitioned to a slot in the wafer transport in the vertical furnace tube. The wafer transport is indexed one position as additional substrates are pre-heated and transitioned. The substrates are thermally cured and are then transitioned from the wafer transport to the cooling chamber employing a first in/first out process. As substrates are being transitioned out of a wafer transport from one furnace tube, more substrates are being transitioned into the wafer transport of the other furnace tube.

39 Claims, 8 Drawing Sheets

IN-LINE CURE FURNACE AND METHOD FOR USING THE SAME

BACKGROUND OF THE INVENTION

1. Field of the Invention

The present invention relates generally to heat treatment of semiconductor wafers, and more specifically to vertical furnaces used in thermal curing of semiconductor wafers during fabrication.

2. Description of the Related Art

Semiconductor devices are formed from silicon wafers containing various circuitry defining the semiconductor device. During the formation of the circuitry on and in the silicon wafer, the wafers are processed through a plurality of fabrication operations to form, define, and refine the layers that make up the multi-layered structure. As is known, some layers are formed over wafers in the form of thin films that must be cured in order to carry out thermolytic reactions and/or remove solvents.

Vertical furnaces have been used in curing processes of semiconductor manufacture for many years. Typically, a vertical furnace is used in batch processing wherein 25 or more wafers at a time are inserted into a vertical furnace tube for heat treatment. Such heat treatment includes the curing of low k dielectric films applied to a surface of a semiconductor wafer. As an alternative to the batch processing of vertical or horizontal furnace tubes, semiconductor wafers are processed individually in curing modules.

FIG. 1A shows a typical prior art single wafer curing module 10. The curing module 10 includes a heating plate 12 and a cooling chamber 20. A semiconductor wafer 11 is positioned within a chamber 14 of the curing module 10 through a door 24 attached to an arm 24a. Once the wafer 11 is within the chamber 14, the door 24 seals the curing environment within. The semiconductor wafer 11 is positioned on lift pins 22 in the curing module 10 as shown. During a heating process, the wafer 11 is lowered onto heating plate standoffs 21 which are integral to the heating plate 12.

After the wafer 11 is heated, the wafer 11 must be cooled to prevent oxidation of the organic components of the film on the surface of the wafer 11 when the wafer is removed from the chamber 14 and once again exposed to the ambient atmosphere. The wafer 11 is cooled by first raising the wafer 11 on the lift pins 22 from the heating plate 12 towards a diffusion plate 18. The diffusion plate serves as a shower head to dispense the cooling medium of the cure module 10. The wafer 11 is typically cooled with water ($H_2O$)-cooled nitrogen gas ($N_2$) flowing through the cooling chamber 20 and dispersed by the diffusion plate 18 and over the wafer 11. Once the wafer 11 is cooled to an appropriate temperature at which the film will not oxidize, the wafer 11 is removed from the curing module 10 through door 24.

Common problems with the curing module 10 processing technique include thermal discontinuities on the surface of the wafer 11 resulting from the lift pins 22. Further, the curing module 10 is generally inefficient in performing both the heating and cooling operations of the curing process. By way of example, while the wafer 11 is being heated, heat rises from the heating plate 12 to the diffusion plate 18 which increases the surface temperature of the diffusion plate 18. The increased temperature of the diffusion plate 18 raises the temperature of the cooled nitrogen gas as it exits through the diffusion plate 18. The higher temperature of the nitrogen gas increases the cooling time of the wafer 11, thereby decreasing the overall efficiency of the curing process. Additionally, the cure module is a single-wafer process, consuming precious time and resources in the wafer fabrication process.

FIG. 1B shows a typical prior art vertical furnace unit 50. The vertical furnace unit commonly includes a heating element 52 which can surround or define the furnace cavity or furnace tube 54. Wafers 11 are staged in a cassette or boat 58 designed specifically for use in a vertical furnace unit 50. The boat 50 can be designed to hold a plurality of wafers 11 ranging from 25 to more than a hundred. The primary advantage of the vertical furnace unit for wafer curing is batch wafer processing.

In the illustrated vertical furnace unit 50, the wafer boat 58 is positioned on a pedestal 56 that lifts and withdraws the wafers 11 into and from the furnace tube 54. The pedestal 56 is commonly configured to provide a means for dispersing $N_2$ while the wafers 11 are disposed within the furnace tube 54. Such dispersion can occur through the pedestal itself acting as a diffusion plate, or by way of providing plumbing or ducting to flow $N_2$ around the wafers 11 and/or within the furnace tube 54.

One common alternative to the pedestal 56 is a wafer boat 58 that is on a gear-driven track configured to move the boat 58 into and out of the furnace tube 54. As an alternative to the vertical orientation of the vertical furnace unit 50, the unit can be configured to be oriented horizontally. In such an orientation, corresponding similar components as those described perform essentially the same functions as described to cure wafers.

There are numerous disadvantages to typical prior art vertical or horizontal furnace units. As true batch processors, vertical or horizontal furnace units that are configured to cure 25 or more wafers at a time are ill suited for single wafer processing such as used in cluster arrangements of spin coat tracks and the like. Further, the furnace tube can result in non-uniform curing of the surface of a wafer as the applied heat in the tube structure results in the periphery of the wafers heating faster and to a greater degree than the center of the wafers. Additionally, in situations in which the desired cure time is short (e.g., less than 15 minutes), the single point of entry into the furnace tube results in a first in/last out wafer curing process. The difference in time at the desired temperature causes a significant difference in the degree of cure experienced by the first wafer and the last wafer in a batch of wafers. In the case of low k dielectric films, the needed cure time can be as short as 3–5 minutes, and the prior art vertical or horizontal furnace units don't provide the necessary high speed and continuous processing.

In view of the foregoing, there is a need for a cure furnace which is configured to efficiently and uniformly cure semiconductor wafers. The cure furnace should be efficient in low k dielectric applications in which high speed and continuous processing is required, and should be configured to integrate batch and single-wafer processing environments. The cure furnace should therefore be configured to avoid the problems of the prior art.

SUMMARY OF THE INVENTION

Broadly speaking, the present invention fills these needs by providing an in-line cure furnace configured to thermally cure films on semiconductor substrates while achieving high through-put, rapid processing, and precisely controlled thermal profiles. The present invention can be implemented in numerous ways, including as a process, an apparatus, a system, a device, or a method. Several embodiments of the present invention are described below.

In one embodiment, an in-line cure furnace is disclosed. The in-line cure furnace includes a vertical furnace tube configured to thermally process a substrate, a hot plate configured to pre-heat the substrate for thermally processing in the vertical furnace tube, and a passageway connecting the hot plate to the vertical furnace tube. The in-line cure furnace further includes a cooling chamber and a passageway connecting the vertical furnace tube to the cooling chamber through which the substrate is transitioned from the vertical furnace tube to the cooling chamber.

In another embodiment, a method for thermally curing a substrate is disclosed. The method includes providing a substrate having a film requiring thermal curing and pre-heating the substrate on a hot plate. The substrate is then transitioned from the hot plate to a cassette disposed within a vertical furnace tube. The cassette is indexed to a next position to receive another substrate, and the method repeats until an entire cassette is filled with substrates. The substrates are then thermally cured in the vertical furnace tube before transitioning the substrates, one at a time, from the cassette to a cool plate, and removing the cooled substrate from the cool plate.

In still a further embodiment, a cure furnace system is disclosed. The cure furnace system includes a vertical furnace tube having a lower region, a middle region, and an upper region. A hot plate is connected to a lower passageway which is connected to the lower region of the vertical furnace tube. A cooling chamber is connected to the upper region of the vertical furnace tube, and a wafer transport is configured to transition semiconductor wafers from the lower region to the upper region of the vertical furnace tube.

In yet another embodiment, a cure furnace system is disclosed. The cure furnace system includes a pair of vertical furnace tubes with each vertical furnace tube having a lower region, a middle region, and an upper region. A hot plate is configured to a lower passageway which is connected to the lower region of each of the pair of vertical furnace tubes. A cooling chamber is configured to the upper regions of the pair of vertical furnace tubes, and a wafer cassette configured to hold substrates is disposed within each of the pair of vertical furnace tubes. The wafer cassette is configured to transition the substrates from the lower region of each vertical furnace tube to the upper region of each vertical furnace tube.

The advantages of the present invention are numerous. One notable benefit and advantage of the invention is the ability to achieve rapid and continuous thermal processing of substrates which is of particular advantage in the processing of low k dielectric films. The present invention provides for pre-heating of a substrate prior to entry into the furnace tube to rapidly bring the substrate to curing temperature. The substrates are transitioned from the hot plate to a wafer transport in the furnace tube, indexed into the furnace tube, cured, and removed to a cooling chamber in a continuous and efficient process that achieves high through-put and rapid curing.

Another benefit is precise temperature control of the wafer curing. The invention implements a first in/first out process for thermal curing within the furnace tube so each substrate is processed through uniform, consistent thermal curing. Each substrate is preheated on a hot plate to overcome prior art problems of non-uniform temperature rise over the entire substrate in a furnace tube. The furnace tube uses heated nitrogen to exclude oxygen and further maintain curing temperature, and implements temperature zones within the furnace tube to precisely shape the temperature profile for thermal cure.

An additional benefit is the ability to configure a pair of vertical furnace tubes separated by the hot plate in the lower regions and the cooling chamber in the upper regions. Using this configuration, the invention can achieve maximum through-put by inserting substrates to be cured into one furnace tube while removing substrates having been cured from the other furnace tube. The invention can thus achieve continuous, uniform, and high volume thermal curing of substrates.

Yet another benefit is the ease with which the present invention is incorporated into a cluster processing arrangement. Because the invention can achieve continuous processing and high through-put, proximity to additional substrate processing apparatus is essential for efficient implementation. The present invention utilizes a single robot to insert and extract substrates from the cure furnace system, and is easily incorporated into a modular cluster arrangement which can include spin-coat, pre-bake, and staging areas for high-volume processing.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for curing semiconductor wafers is disclosed. In preferred embodiments, the invention includes at least one in-line vertical cure furnace, in one embodiment two in-line cure furnaces, and method of use which provides rapid and continuous thermal processing of wafers. Such processing is particularly advantageous in low k dielectric applications in which relatively high speed, high through-put, and continuous processing are desirable. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
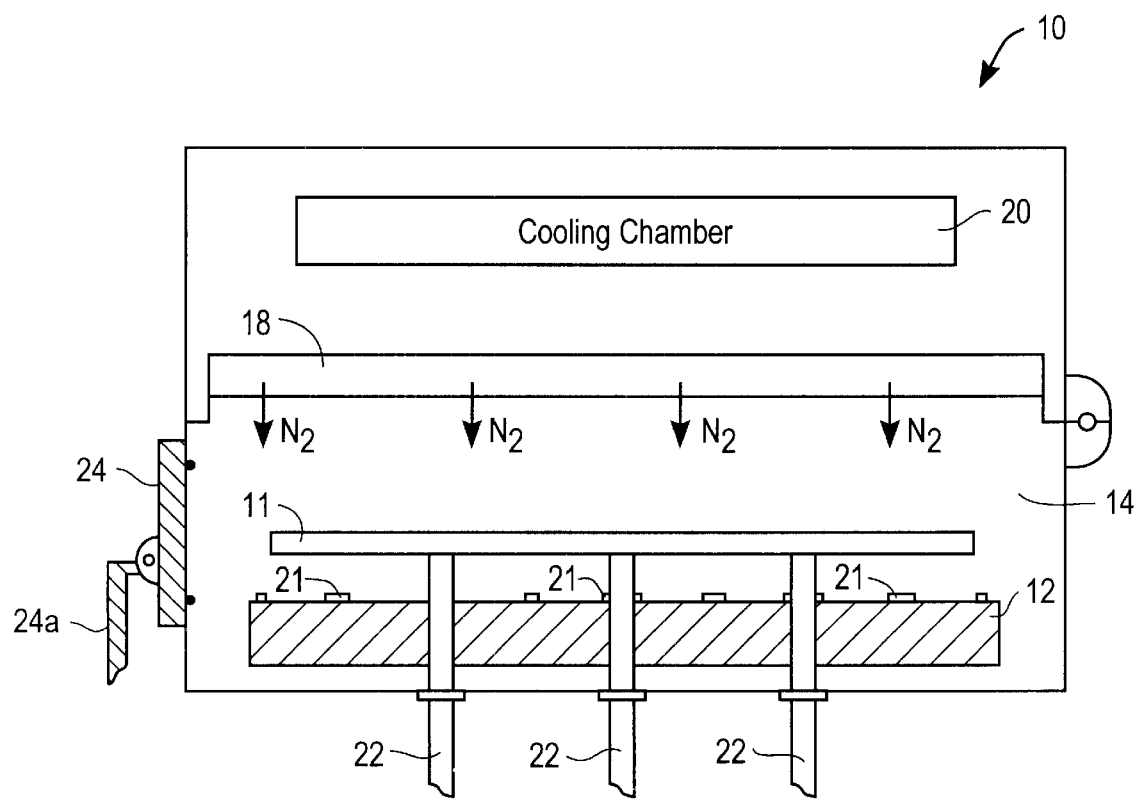
FIG. 1A shows a typical prior art single wafer curing module.
Figure 1B:
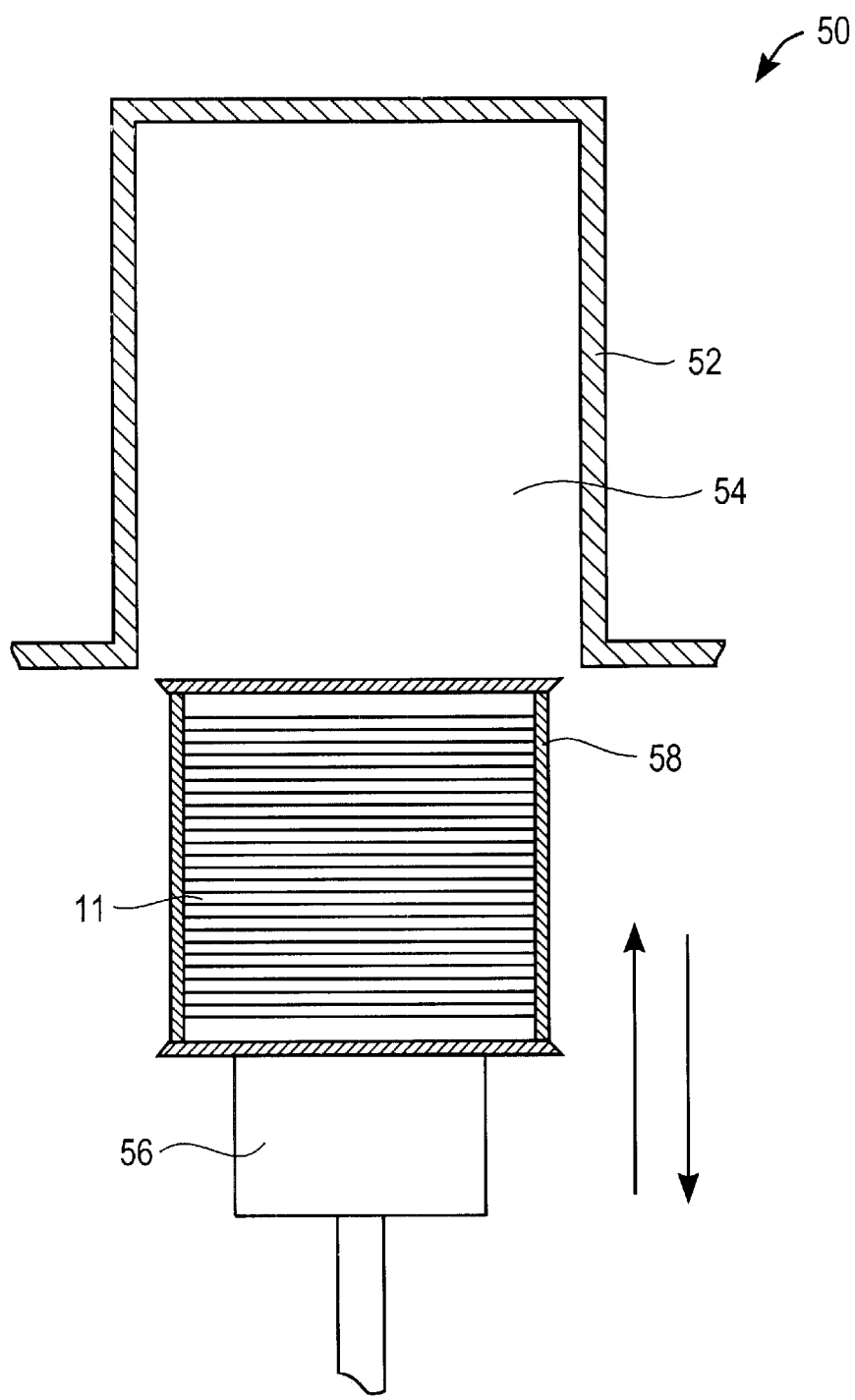
FIG. 1B shows a typical prior art vertical furnace unit.
Figure 2:
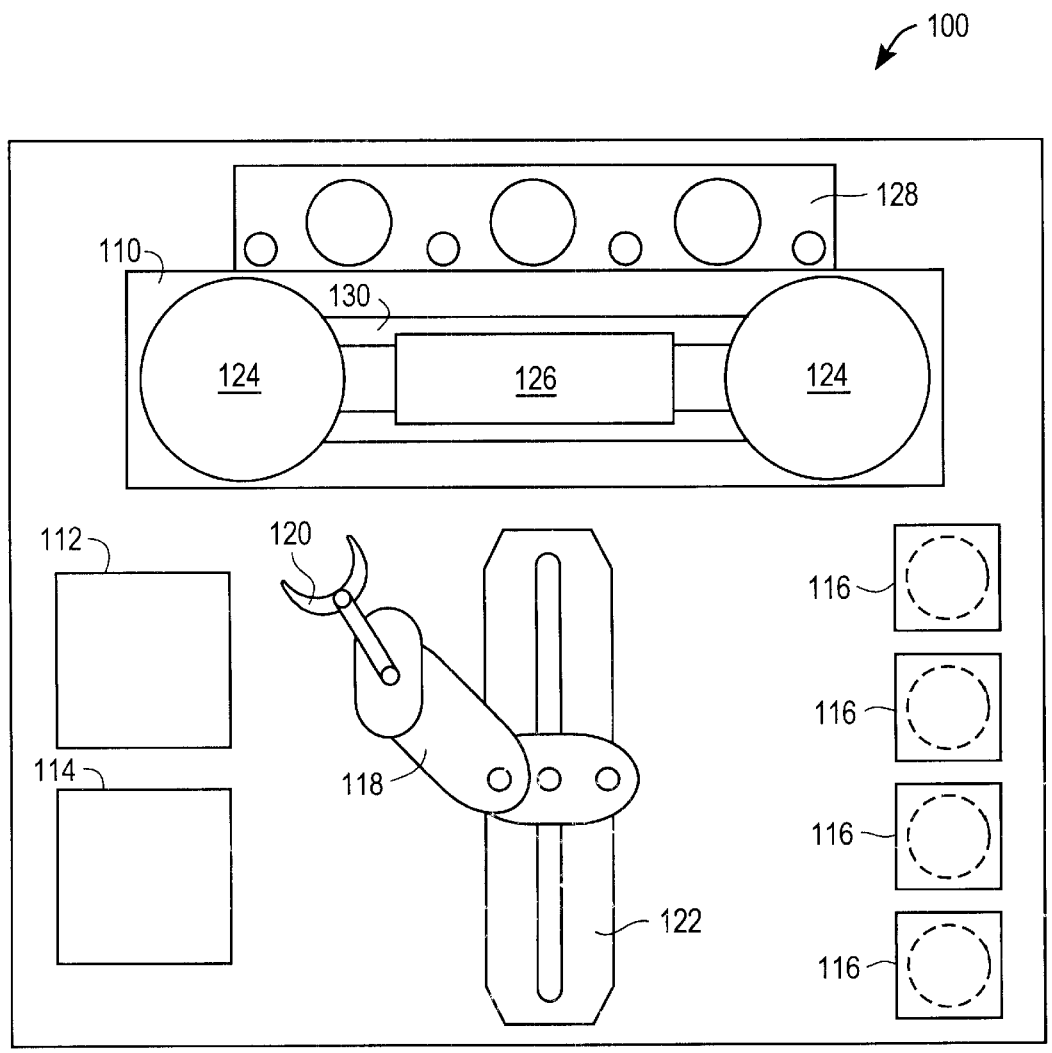
FIG. 2 shows a wafer processing cluster incorporating an in-line cure furnace in accordance with one embodiment of the present invention.

FIG. 2 shows a wafer processing cluster 100 incorporating an in-line cure furnace 110 in accordance with one embodiment of the present invention. A wafer processing cluster 100 includes a plurality of processing apparatus arranged for efficient processing of semiconductor wafers. In FIG. 2, the wafer processing cluster 100 includes the in-line cure furnace 110, a soft bake module 112, a spin coat module 114, and a plurality of cassettes 116, each cassette 116 containing a plurality, typically 25, of wafers. A robot 118 is positioned near the center of the processing cluster 100 in a track 122 and is configured to access all areas of the processing cluster 100. An end effector 120 is attached to the robot 118 to manipulate individual semiconductor wafers between the various processing modules, apparatus and cassette stations.

The processing modules and apparatus of a wafer processing cluster 100 are selected and arranged in accordance with a particular wafer fabrication requirement. In FIG. 2, the soft bake module 112 and the spin coat module 114 might each contain a plurality of apparatus, in a stacked orientation, to provide for multiple and simultaneous wafer processing. In another embodiment, the soft bake module 112 might be replaced with an additional spin coat module 114. The modularized arrangement of wafer fabrication apparatus provide for maximum flexibility to meet processing needs.

The in-line cure furnace 110, in one embodiment, includes two vertical furnace tubes 124. A single hot plate (not shown in FIG. 2) is located between the two vertical furnace tubes 124 in a lower region of the in-line cure furnace 110. A single cooling chamber 126 is located between the two vertical furnace tubes 124 in an upper region of the in-line cure furnace 110. As described more completely below in reference to FIGS. 4 and 5, the cooling chamber 126 is connected to each of the vertical furnace tubes 124 by a sealed passageway 130. In one embodiment, a water-cooled cool plate (see FIG. 5) is disposed within the cooling chamber 126 which is independently supplied with cooling nitrogen gas ($N_2$) to cool a wafer prior to exposure to the ambient atmosphere. In a rear portion 128 of the in-line cure furnace 110, ducting and/or plumbing is provided for the supply of $N_2$ to the cooling chamber 126, and for $N_2$ return from an upper exhaust to a lower pre-heating region for use in the vertical furnace tubes 124. Further, Helium (He) is supplied to the cooling chamber 126 for wafer cooling in one embodiment. Helium is used for its superior thermal conductivity properties, and to maintain a stand-off or gap, typically 5 mils or 0.6 mm, between the wafer and the cool plate as described in greater detail below in reference to FIG. 5.

In another embodiment of the present invention, the in-line cure furnace 110 includes a single vertical furnace tube 124. In the single vertical furnace tube 124 configuration, the sealed passageway 130 is sealed to the single vertical furnace tube 124, and the cooling chamber 126 is sealed with a door (not shown) through which a wafer is extracted by the robot when appropriately cooled. Similarly, the single hot plate (not shown) is configured to the single vertical furnace tube 124 in a lower region of the in-line cure furnace 110.

Figure 3:
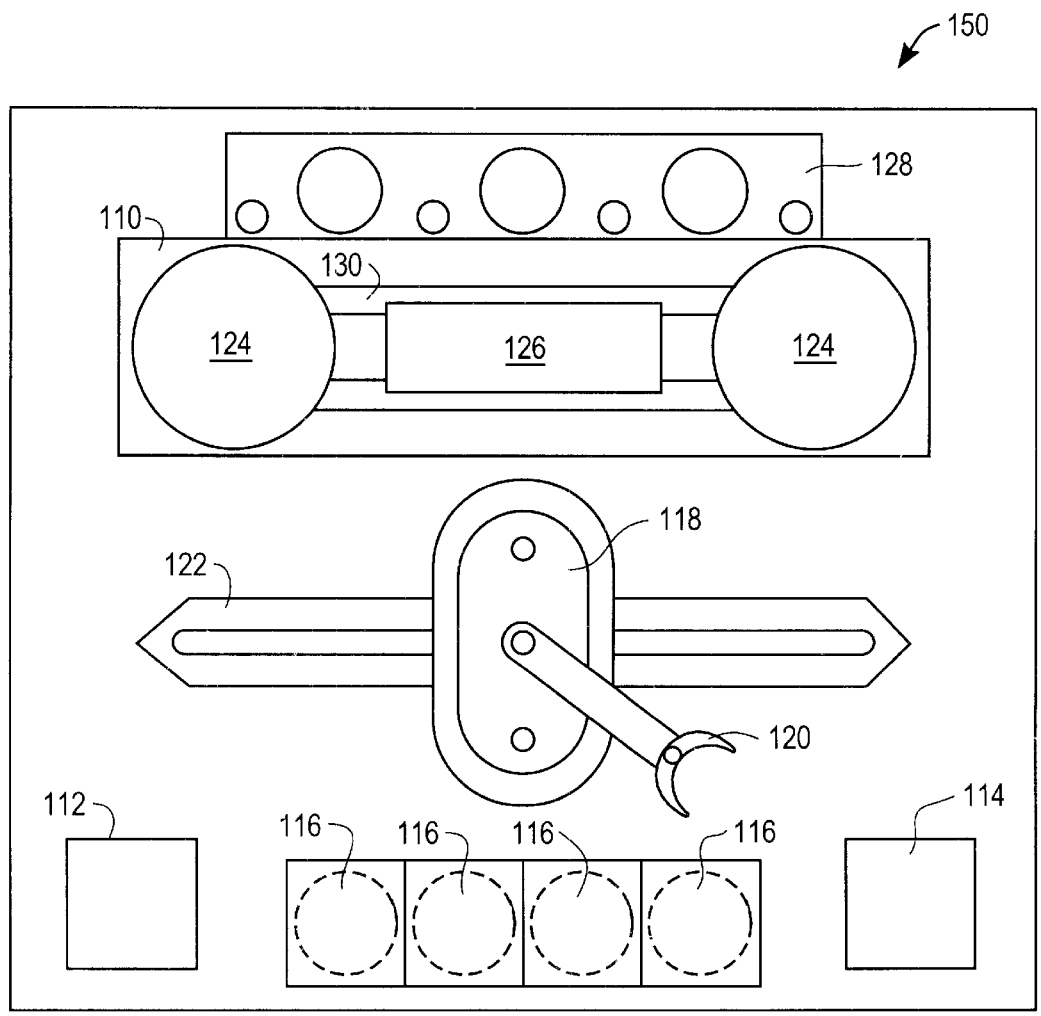
FIG. 3 shows an alternative embodiment of a wafer processing cluster incorporating an in-line cure furnace in accordance with one embodiment of the present invention.

FIG. 3 shows an alternative embodiment of a wafer processing cluster 150 incorporating an in-line cure furnace 110 in accordance with one embodiment of the present invention. In the embodiment shown in FIG. 3, the wafer processing cluster 150 is arranged with the in-line cure furnace 110 at one end of the wafer processing cluster 150, and processing apparatus including a soft bake module 112 and a spin coat module 114 on the opposite end of the wafer processing cluster 150. A robot 118 is mounted in a track 122 between the in-line cure furnace 110 and the processing apparatus. Between the modularized processing apparatus 112, 114 is a staging or load/unload area containing a plurality of wafer cassettes 116. In one embodiment, the staging area consists of designated areas for cassettes 116 of wafers awaiting processing in the wafer processing cluster 150, and cassettes 116 of wafers awaiting transport to a next processing location after having been processed.

As described above with reference to FIG. 2, the robot 118 is configured to access all areas of the wafer processing cluster 150, and includes an end effector 120 to manipulate individual semiconductor wafers and transition wafers between the cassettes of wafers 116, the processing apparatus 112, 114 and the in-line cure furnace 110. Further, the modularized processing apparatus 112, 114 can be configured to include a plurality of, for example, soft bake apparatus 112 in a vertically stacked orientation, and a plurality of spin coat apparatus 114 in a vertically stacked orientation, the apparatus can be configured as single processing tools, or the apparatus can be modified to meet the processing requirements of a particular application. For example, the soft bake apparatus 112 can be replaced with a second spin coat 114 modular arrangement as processing requirements dictate.

Figure 4:
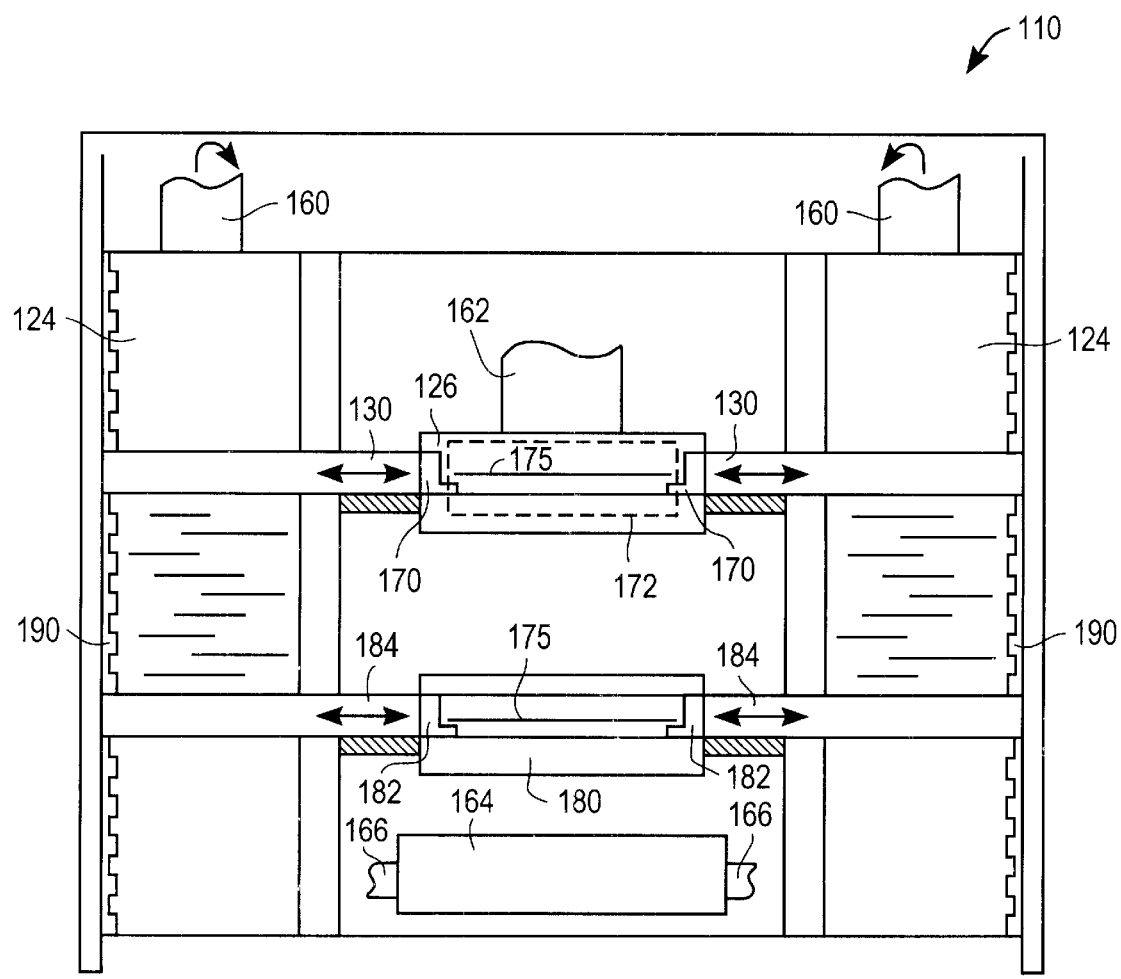
FIG. 4 shows an in-line cure furnace in accordance with one embodiment of the present invention.

FIG. 4 shows an in-line cure furnace 110 in accordance with one embodiment of the present invention. The in-line cure furnace 110 in the illustrated embodiment includes two vertical furnace tubes 124. In another embodiment, the in-line cure furnace includes a single vertical furnace tube 124. As described above in reference to FIGS. 2 and 3, the vertical furnace tubes 124 are separated by a single hot plate 180 in a lower region of the in-line cure furnace 110, and by a single cooling chamber 126 in an upper region of the in-line vertical furnace 110.

The cooling chamber 126 defines and maintains a sealed environment to ensure the hot wafer 175 is not exposed to ambient atmosphere prior to being cooled to the appropriate temperature. The cooling chamber 126 includes a separate and independent $N_2$ supply 162 to bathe the wafer 175 in cooling $N_2$, a door 172 that seals the cooling chamber 126 until the cooled wafer 175 is ready to be removed from the in-line cure furnace 110, and a sealed passageway 130 between the cooling chamber 126 and each of the two vertical furnace tubes 124. In one embodiment, Helium is supplied to the cooling chamber 126 in addition to $N_2$. A wafer shuttling mechanism 170 transitions the wafer 175 from either of the two vertical furnace tubes 124 into the cooling chamber 126. In one embodiment, the wafer shuttling mechanism 170 serves as a door to seal the cooling chamber 126 from the sealed passageway 130 and each of the vertical furnace tubes 124. In another embodiment, a separate door (not shown) is provided to seal the cooling chamber from the sealed passageway 130 and each of the vertical furnace tubes 124.

The hot plate 180 is located between the two vertical furnace tubes 124 in a lower region of the in-line cure furnace 110. The hot plate 180 pre-heats the wafer 175 for more effective, efficient, and uniform curing of wafers 175 in the vertical furnace tubes 124. A wafer 175 is positioned on the hot plate 180 for pre-heating. The wafer 175 is then transitioned to either of the two vertical furnace tubes 124 by a wafer shuttling mechanism 182 through passageway 184. In one embodiment, the passageway 184 is sealed in a similar manner as passageway 130 described above. In another embodiment, the passageway 184 is closed, but not sealed, to maintain a generally restricted flow or environment between the hot plate 180, the passageway 184 and each of the vertical furnace tubes 124.

The vertical furnace tubes 124 are configured to thermally cure wafers 175 in a continuous processing operation. In one embodiment, a wafer 175 is pre-heated on the hot plate 180, and then the wafer 175 is moved through passageway 184 by wafer shuttling mechanism 182 and positioned in a slot in a wafer transport (not shown) located in the vertical furnace tube 124. The wafer transport then indexes up one position, the equivalent of one slot in the wafer transport, to place the next slot in the wafer transport in position to receive the next wafer 175. The wafer transport is typically a wafer cassette attached to a track or positioned on a lift pedestal, but in alternative embodiments the wafer transport is a fixed rack configured to hold and transport wafers within the vertical furnace tubes 124 maintaining a desired distance between wafers or, in some applications, configured for a specific number of wafers dictated by the desired process or type of film to be thermally cured. The process operation is more completely described below in reference to FIGS. 6–7. In FIG. 4, the wafer transport (not shown) is indexed up through the vertical furnace tube 124 with a track 190 configured to support and move a cassette or rack of wafers through the vertical furnace tube 124. In another embodiment, the wafer transport is moved through the vertical furnace tube 124 with a pedestal and lift device that is configured to raise the wafer transport through the vertical furnace tube 124 one position at a time.

In one embodiment, each vertical furnace tube 124 is a generally sealed environment into which heated $N_2$ is supplied to exclude oxygen ($O_2$) and maintain the wafers at a thermal curing temperature. A $N_2$ pre-heater 164 is configured to heat the $N_2$ to an appropriate temperature for thermally curing wafers within the vertical furnace tube 124, typically 300° C.–500° C., and preferably about 400° C. The heated $N_2$ is then flowed into each vertical furnace tube 124 into a bottom region of each vertical furnace tube 124 through $N_2$ supply 166. The heated $N_2$ is maintained flowing through the vertical furnace tube 124 and exhausted through an upper $N_2$ exhaust 160. The exhausted $N_2$ is then returned through ducting and/or plumbing in a rear portion of the in-line cure furnace (see FIGS. 2 and 3) to the $N_2$ pre-heater 164 so that at least some of the $N_2$ is recycled through the in-line furnace 110. The vertical furnace tube 124 is configured to allow the heated $N_2$ to flow from the bottom region of the tube to the upper $N_2$ exhaust, and generally flow up the sides of the vertical furnace tubes 124 and between and around the wafers at approximately atmospheric pressure.

As shown in the embodiment in FIG. 4, each vertical furnace tube 124 has an upper, a middle, and a lower region. These regions are configured so that if a cassette for wafers is used to hold and transition wafers through the vertical furnace tubes 124, a cassette can extend into the lower region when the upper-most slot of the cassette is in position to receive a wafer 175 from the hot plate 180, and the cassette can extend into the upper region when the lower-most slot of the cassette is in position to transition a wafer 175 to the cooling chamber 126. Thus, while an empty portion of a cassette may extend into either the upper region or the lower region of the vertical furnace tube, wafers transition through and are thermally cured in the middle portion of the vertical furnace tube. A rack configured to a track would similarly extend into the upper and lower regions.

Figure 5:
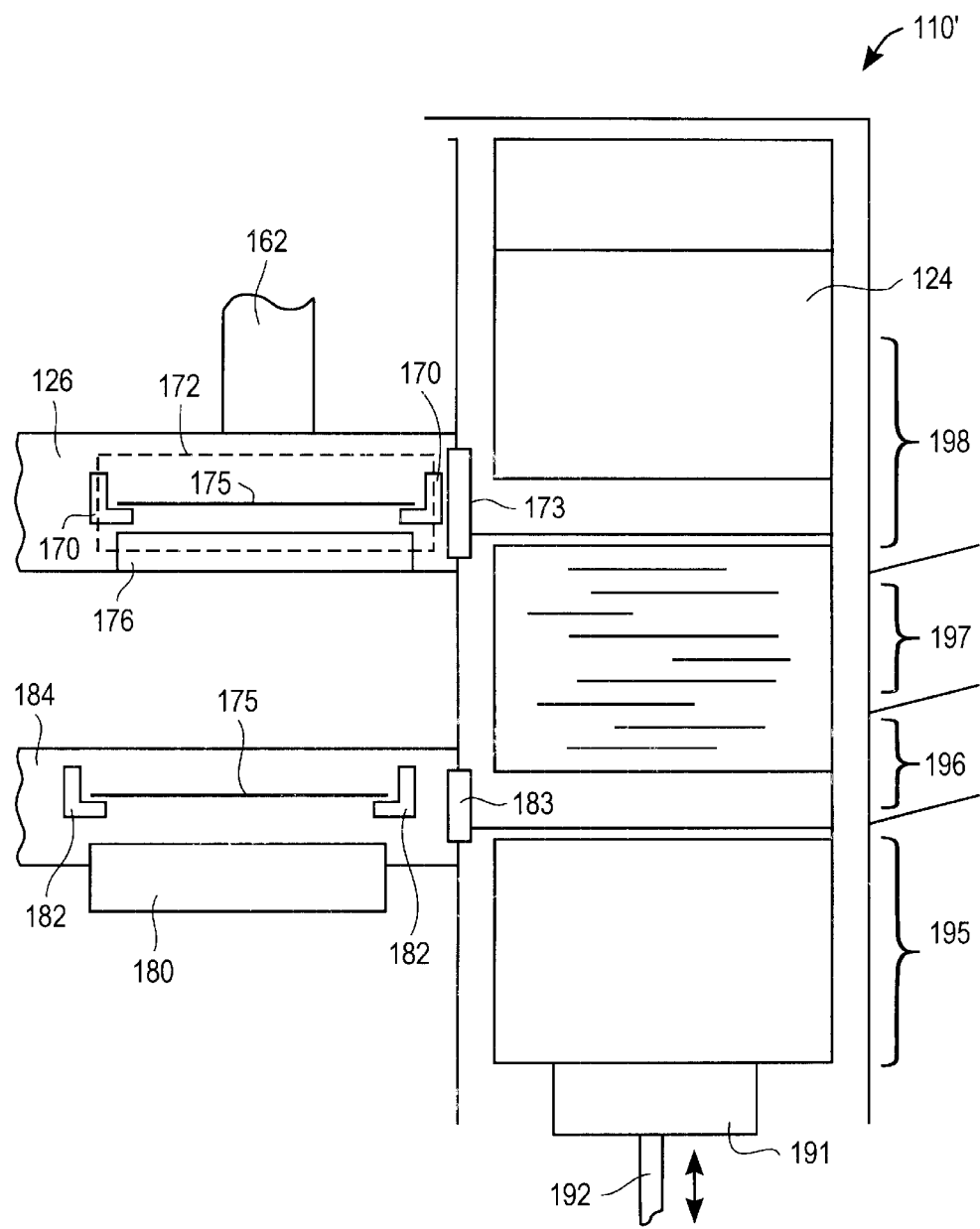
FIG. 5 illustrates an alternative embodiment of an in-line cure furnace.

FIG. 5 illustrates an alternative embodiment of an in-line cure furnace 110'. A single vertical furnace tube 124 is shown with a single cooling chamber 126 in an upper region of the in-line cure furnace 110', and a single hot plate 180 in a lower region of the in-line cure furnace. For ease of illustration, the cooling chamber 126 and the hot plate 180 are shown from a front view, but in any of several embodiments, the cooling chamber 126 and the hot plate 180 can be oriented with the "front" or wafer 175 insertion or extraction access facing in any direction except into the vertical furnace tube 124.

The cooling chamber 126 is a sealed chamber so that the wafer 175 remains isolated from the ambient atmosphere until cooled to an appropriate temperature to avoid oxidation. The cooling chamber 126 cools the wafer 175 with independently supplied and cooled $N_2$ flowing through $N_2$ supply 162. In one embodiment, the cooling chamber 126 includes an additional cooling element or cooling plate 176. The cooling plate 176 is typically water cooled and, in one embodiment, Helium is used in a space maintained between the cooling plate 176 and the wafer in order to ensure no direct contact between the wafer surface and the cooling plate 176. Because the cooling chamber 126 must remain sealed until the wafer 175 has cooled to an acceptable temperature at which the wafer 175 can be exposed to the ambient atmosphere without the risk of oxidation, a door 172 is provided that seals the opening through which a wafer 175 is extracted from the cooling chamber 126. The cooling chamber 126 is sealed from the vertical furnace tube 124 by door 173 which opens to allow the wafer shuttle mechanism 170 to transition a wafer 175 from a slot in the wafer transport located in the vertical furnace tube 124 into the cooling chamber 126, and then closes to seal the cooling chamber 126 so that the wafer 175 can be cooled. In another embodiment, the shuttle mechanism 170 also serves as the door to seal the cooling chamber 126.

The hot plate 180 in the lower region of the in-line cure furnace 110' is contained within passageway 184, and provides for pre-heating of the wafer 175 prior to insertion into a slot in the wafer transport within the vertical furnace tube 124. In one embodiment, a door 183 is configured between the passageway 184 containing the hot plate 180 and the vertical furnace tube 124 in order to maintain the necessary temperature and $N_2$ flow within the vertical furnace tube 124. Once the wafer 175 has been pre-heated to the desired temperature, the wafer shuttle mechanism 182 engages the wafer 175 and the door 183 opens to allow the wafer to be transitioned into a slot in a wafer transport in the vertical furnace tube 127. The wafer shuttle mechanism 182 returns to position near the hot plate 180, and the door 183 is closed separating the vertical furnace tube 124 from the passageway 184.

FIG. 5 also illustrates an embodiment utilizing a pedestal 191 and lift 192 to move a cassette of wafers through the vertical furnace tube. As described above in reference to FIG. 4, the pedestal 191 is configured to index a cassette of wafers up through the vertical furnace tube 124 at an incremental distance equivalent to one slot in the wafer cassette such that once a wafer 175 has been inserted from the hot plate 180 into the cassette in the vertical furnace tube 124, the lift 192 indexes the pedestal 191 with the cassette thereon upward one position so the next available slot in the cassette is in position to receive the next wafer 175 after the wafer 175 has been pre-heated. Similarly, when a wafer 175 has been removed from the cassette for transitioning to the cooling chamber 126, the lift 192 indexes the pedestal 192 with the cassette thereon upwards one position such that the next wafer 175 to be removed from the cassette and transitioned to the cooling chamber 126 is in position to be engaged by the wafer shuttle mechanism 170.

As described above in reference to FIG. 4, heated $N_2$ is flowed into the vertical furnace tube 124 in a bottom region of the vertical furnace tube and exhausted through an $N_2$ exhaust in a top region of the vertical furnace tube. In one embodiment, a primary function of the $N_2$ is to exclude $O_2$ from the atmosphere within the vertical furnace tube 124. The $N_2$ is pre-heated to maximize the thermal curing of the wafers 175, and the vertical furnace tube 124 is generally configured to flow the $N_2$ up the sides of the vertical furnace tube 124 as well as bathe the wafers 175 in heated $N_2$ at atmospheric pressure.

In one embodiment of the present invention, thermal zones are configured within the vertical furnace tubes 124 for the thermal curing of the wafers 175. The thermal zones are configured to provide precise temperature control and wafer cure control through temperature profile shaping in accordance with the specific wafer process used. In FIG. 5, representative thermal zones are illustrated. By way of example, the thermal zone 195 might have no applied heat to the vertical furnace tube 124 and the area within thermal zone 195 is heated by the pre-heated $N_2$ flowing into the lower region of the vertical furnace tube 124. The pre-heated N2 in thermal zone 195 can also serve to preheat a wafer transport being indexed through thermal zone 195.

Thermal zones 196, 197 and 198 can be controlled and modified in accordance with process requirements. By way of example, the temperature profile for a low k dielectric curing process might need to be maintained in a range of 350–450° C. In thermal zone 196, the temperature might be maintained at a higher point in the range, e.g., 450° C., in order to compensate for any temperature loss in wafer 175 transfer from the hot plate 180 into the vertical furnace tube 124. Additional thermal zones 197 and 198 can be adjusted and controlled in accordance with process requirements. Further, if no temperature variation is desired, thermal zones 195, 196, 197 and 198 are exemplary only, and instead of thermal zones the temperature within the vertical furnace tube can be maintained at a constant and uniform point. If process requirements dictate, there can be more or fewer thermal zones than those shown in FIG. 5.

Figure 6:
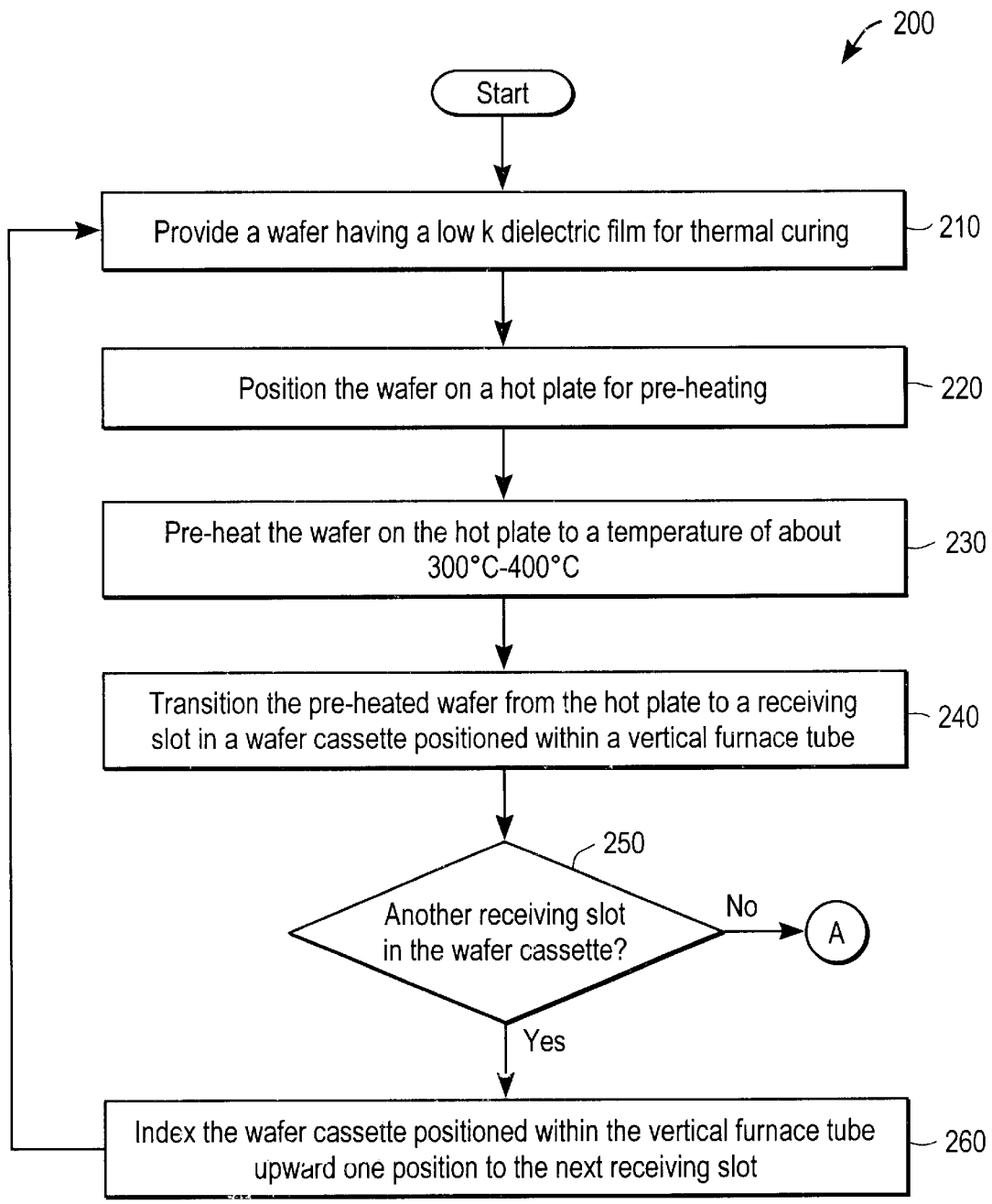
FIGS. 6–7 show a flow chart diagram illustrating the method operations performed in the thermal cure of a semiconductor wafer in accordance with one embodiment of the present invention.
Figure 7:
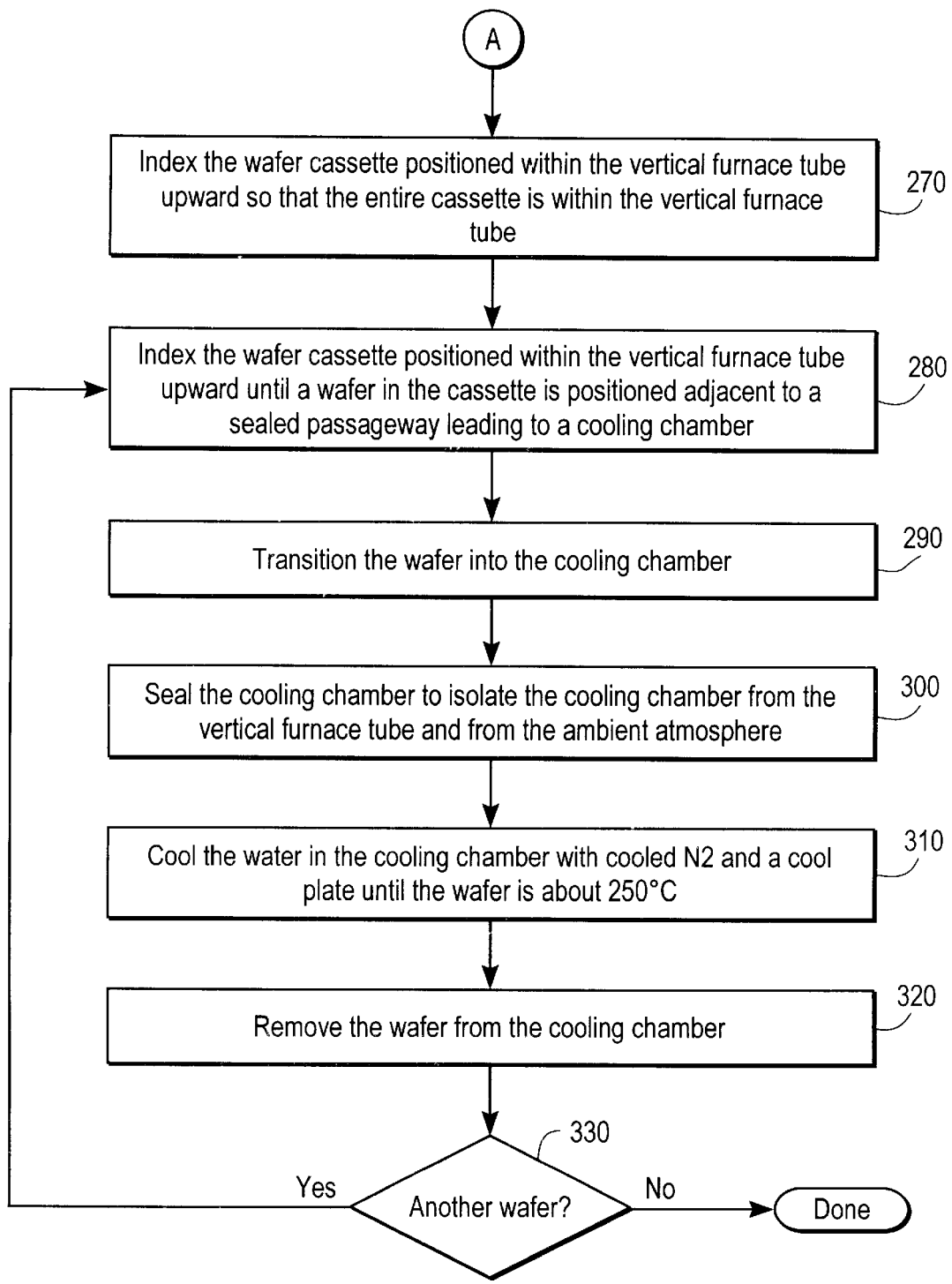

FIGS. 6–7 show a flow chart diagram 200 illustrating the method operations performed in the thermal cure of a semiconductor wafer in accordance with one embodiment of the present invention. In one embodiment, the present invention is particularly well suited for the thermal cure of low k dielectrics requiring a relatively rapid cure in a continuous operation that integrates both batch and single-wafer processing characteristics. The method begins in FIG. 6 with providing a wafer having a low k dielectric film for thermal curing in operation 210. As described in reference to FIGS. 2 and 3, the present invention can be implemented in a wafer processing cluster configuration. In such an arrangement, the providing of a wafer in operation 210 might occur when a robot removes a semiconductor wafer from a wafer spin-coating apparatus to the present invention. In those applications where a soft bake is a necessary process step following the spin-coating, the robot might transition the wafer from the spin-coat apparatus to the soft bake apparatus, and then after the soft bake process, the robot transitions the wafer to the present invention.

The method continues with operation 220 in which the wafer is positioned on the hot plate for pre-heating. Typically, this operation includes the robot inserting the wafer over the hot plate of the present invention, and the wafer being engaged by lift pins, in one embodiment, or by the shuttle mechanism, in another embodiment, or by some other mechanism allowing the robot with an end effector holding a wafer to disengage the wafer and position the wafer on the hot plate.

Next, in operation 230, the wafer is pre-heated on the hot plate to a temperature of about 300° C.–400° C. In the illustrated embodiment, a wafer with a low k dielectric film to be cured is pre-heated to near the desired curing temperature prior to insertion into the furnace tube. Operation 230 is a pre-heating operation and not a curing operation. In one embodiment, the pre-heating facilitates optimum curing in the furnace tube, but as a pre-heat and not a cure operation, typical problems with hot plate curing operations are avoided. By way of example, hot spots or non-uniform temperature distribution caused by lift pins and wafer stand-offs can degrade the curing operation in some hot plate applications, but in one embodiment of the present invention, the wafer is only pre-heated on the hot plate for approximately 1–2 minutes, and the curing occurs in the furnace tube where conditions are better suited for more uniform heat distribution. A common problem with furnace tube thermal curing is that the periphery of a wafer tends to increase in temperature faster than the center of the wafer resulting in non-uniform temperature distribution. By pre-heating the wafer before inserting it into the furnace tube, such temperature differential is minimized. In one embodiment, the wafer that is pre-heated on the hot plate as described, is further bathed in pre-heated $N_2$ during the pre-heat operation 230, and during the following transition operation 240 as described below. The pre-heated $N_2$ aids in maintaining the wafer temperature as it enters the tube in the following operation.

The method continues with operation 240 in which the pre-heated wafer is transitioned from the hot plate to a receiving slot in a wafer cassette positioned within the vertical furnace tube. In one embodiment, the transitioning is by a wafer shuttle mechanism. Such a mechanism engages the wafer from the hot plate once it has been pre-heated to the desired temperature, and transitions the wafer along the passageway that connects the hot plate to the vertical furnace tube. The wafer shuttle mechanism then inserts the wafer into a slot in the wafer cassette inside the vertical furnace tube. By way of example, the wafer cassette might have approximately 25 slots or positions for semiconductor wafers. The wafer cassette would be inside the vertical furnace tube and initially positioned such that an upper-most slot or position for a wafer would be approximately level with the passageway from the hot plate. The remaining slots and cassette would extend down into a lower region of the vertical furnace tube below the level of the passageway from the hot plate.

The method advances with decision block 250 in which it is determined whether or not there is another slot for a wafer in the wafer cassette. If there are no more slots, e.g., the cassette is full, the method proceeds through connector "A" to the continuation of the flow chart diagram 200 in FIG. 7. If there are more slots in the wafer cassette to receive wafers, the method advances to operation 260.

In operation 260, the wafer cassette is indexed upward one position so the next slot in the wafer cassette is level with the passageway from the hot plate. In one embodiment, the wafer cassette in the vertical furnace tube is configured to a track which advances the wafer cassette through the vertical furnace tube. Once the cassette has reached the top of the vertical furnace tube and the last wafer is removed from the wafer cassette as described below, the cassette is lowered along the track back to the initial position in which the upper-most slot is once again level with the passageway from the hot plate, the remaining slots and wafer cassette extend into the lower region of the vertical furnace tube, and the in-line cure furnace is once again ready to receive a first wafer.

In another embodiment, the wafer cassette is positioned on a pedestal within the vertical furnace tube. The pedestal is raised and lowered with a lift and in operation 260 the cassette is indexed upward one position to receive the next wafer. The pedestal and lift operate in the same manner as the track described above, and when the cassette reaches the upper-most position and the last wafer in the cassette is removed, the pedestal and lift lower the cassette through the vertical furnace tube to the initial position to receive a next wafer.

In still a further embodiment, a rack is used within the vertical furnace tube to transport wafers to be thermally cured. The rack can be configured to be fixed to a track as described for the cassette above, or can be positioned on a lift pedestal as also described. The rack configuration is similar to the cassette, but is configured for specific use within a vertical furnace tube.

The method next loops back to operation 210 wherein a next wafer having a low k dielectric film is provided for thermal curing. It is to be understood that the providing of a next wafer can occur as soon as the previous wafer has been transitioned from the hot plate to the wafer cassette. The method continues with the described operations until no more receiving slots are available in the wafer cassette, e.g., the wafer cassette is full. When the cassette is full, the method proceeds through connector "A" to the continuation of the flow chart diagram 200 shown in FIG. 7.

In FIG. 7, the method continues through connector "A" with operation 270 in which the wafer cassette is indexed upward so that the entire wafer cassette is within the vertical furnace tube in a middle region between the passageway from the hot plate to the vertical tube, and the passageway between the vertical furnace tube and the cooling chamber. As described above in reference to FIGS. 4 and 5, the thermal curing of the wafers takes place in the middle region of the vertical furnace tube. In one embodiment, thermal zones are configured to shape a precise temperature profile for the curing of a wafer. Hot $N_2$ bathes the wafers as it travels up the vertical furnace tube along the sides of the tube as well as in and around the wafers in the wafer cassette. The hot $N_2$ both excludes $O_2$ from the cure environment as well as assists in maintaining the precisely shaped temperature profile within the vertical furnace tube.

In one embodiment of the present invention, the method of thermally curing a semiconductor wafer implements a first in/first out process. Thus, the first wafer to be inserted into the vertical furnace tube is the first wafer to be withdrawn from the tube and processed through the cooling chamber. The amount of time required to process a particular wafer film determines the amount of time the cassette of wafers remains within the vertical furnace tube. The rate of the removal of wafers from the cassette and furnace is the same as the rate of insertion, so each wafer is cured for approximately the same amount of time resulting in uniform and consistent thermal curing of wafers.

When the first wafer has been within the furnace tube for the desired amount of time, the method advances to operation 280 in which the wafer cassette is indexed into position with the uppermost wafer in the cassette approximately level with the passageway from the vertical furnace tube to the cooling chamber. Next, the method proceeds to operation 290 in which the wafer is transitioned from the wafer cassette within the vertical tube to the cooling chamber. The transitioning occurs through the sealed passageway between the vertical furnace tube and the cooling chamber.

Next, the method advances to operation 300. Once the wafer has transitioned into the cooling chamber, the cooling chamber is sealed so that the wafer can be cooled. The chamber must be sealed from the "outside" ambient atmosphere as the wafer cannot be exposed to $O_2$ until cooled below approximately 250° C. to prevent oxidation. Further, the chamber must be sealed from the vertical furnace tube since the vertical furnace tube is maintained at a temperature of approximately 300–500° C., and contains heated $N_2$ flowing through the vertical furnace tube.

In operation 310 the wafer is cooled in the cooling chamber. In one embodiment, the wafer is cooled to a temperature of about 250° C. by flowing cooled $N_2$ into the cooling chamber and bathing the wafer in the cooled $N_2$. In another embodiment, the wafer is cooled to a temperature of about 250° C. by placing the wafer on, or under, a cooling plate and flowing cooled $N_2$ into the chamber and around the wafer. In one embodiment using a cool plate, the wafer is on or under the cool plate for approximately 1 minute. As described above, the cooled $N_2$ is used to both exclude $O_2$ from the atmosphere in the cooling chamber until the wafer is sufficiently cooled to prevent oxidation, as well as serving as a heat exchanger to cool the wafer.

Once the wafer is sufficiently cooled, the method advances to operation 320 and the wafer is removed from the cooling chamber. As described above in reference to the robot placing a wafer on the hot plate, the robot inserts an end effector into the cooling chamber through an access door, the end effector engages the cooled wafer, and the wafer is extracted from the cooling chamber. In a wafer processing cluster configuration, the wafer might be inserted into an output cassette in an input/output, staging, or load/unload area.

The method next advances to decision block 330 to determine whether more wafers need to be removed from the vertical furnace tube. So long as there are more wafers to be removed, the method loops back to operation 280 where the cassette is indexed up one position to place the next wafer in position to be transitioned to the cooling chamber. The method continues as described until all of the wafers in the cassette, having been thermally cured in the vertical furnace tube, are removed and the method is done.

An alternative embodiment of the method described incorporates a twin-tube in-line cure furnace as shown in FIG. 4. In such an embodiment, the method performs continuous thermal processing by simultaneously loading one cassette with wafers for thermal curing while unloading a cassette of wafers having just been processed. Thus, after the robot inserts a wafer over and on the hot plate, the robot moves the end effector to the cooling chamber and extracts a cured wafer. As wafers are inserted one-by-one into one of the vertical furnace tubes, wafers are extracted one-by-one from the other vertical furnace tube. The time each wafer is on the hot plate or in the cooling chamber is approximately the same, allowing for a continuous and rapid thermal processing of wafers that is integrated into a wafer processing cluster configuration, and incorporates the most efficient use of both batch and single wafer processing.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An in-line cure furnace, comprising:
   a vertical furnace tube configured to thermally process a substrate;
   a hot plate being oriented adjacent to and external to the vertical furnace tube, the hot plate configured to receive and pre-heat the substrate before being thermally processed in the vertical furnace tube; and
   a first passageway connecting the hot plate to the vertical furnace tube and through which the substrate is transitioned from the hot plate into the vertical furnace tube.

2. An in-line cure furnace as recited in claim 1, further comprising:
   a cooling chamber being oriented adjacent to and external to the vertical furnace tube; and
   a second passageway connecting the vertical furnace tube to the cooling chamber and through which the substrate is transitioned from the vertical furnace tube to the cooling chamber.

3. An in-line cure furnace as recited in claim 2, further comprising:
a door between the second passageway and the vertical furnace tube, the door having an open position and a closed position and when in the closed position the door being configured to seal the passageway from the vertical furnace tube; and
an access door on an exterior side of the cooling chamber, the access door having an open position and a closed position and when in the closed position the access door being configured to seal the cooling chamber from an ambient atmosphere.

4. An in-line cure furnace as recited in claim 3, wherein the cooling chamber is configured to receive cooled nitrogen gas when the door is in the closed position and the access door is in the closed position and the substrate is within the cooling chamber having been transitioned from the vertical furnace tube through the second passageway.

5. An in-line cure furnace as recited in claim 4, further comprising a cool plate configured to cool the substrate, the cool plate being disposed within the cooling chamber.

6. An in-line cure furnace as recited in claim 5, wherein the cooling chamber is configured to receive helium in a space between the substrate and the cool plate.

7. An in-line cure furnace as recited in claim 1, wherein the vertical furnace tube includes a lower region, a middle region, and an upper region, and wherein the middle region is configured with at least one thermally controlled zone.

8. An in-line cure furnace as recited in claim 7, wherein the lower region of the vertical furnace tube is configured to receive heated nitrogen and the upper region is configured to exhaust heated nitrogen.

9. An in-line cure furnace as recited in claim 8, further comprising a nitrogen pre-heater located below the hot plate and configured to heat the nitrogen to be received by the lower region, and wherein the nitrogen exhausted from the upper region flows to the pre-heater.

10. An in-line cure furnace as recited in claim 9, further comprising a substrate transport configured to hold a plurality of substrates, the substrate transport being disposed within the vertical furnace tube and configured to move from the lower region to the upper region and from the upper region to the lower region.

11. An in-line cure furnace as recited in claim 10, wherein the substrate transport includes a substrate cassette, and a substrate rack.

12. A method for thermally curing a substrate comprising:
(a) providing a substrate having a film requiring thermal curing;
(b) pre-heating the substrate on a hot-plate;
(c) transitioning the substrate to a first position for receiving the substrate in a cassette disposed within a first furnace tube, the transitioning being from the hot plate, wherein the hot plate is oriented external to and adjacent to the first furnace tube;
(d) indexing the cassette disposed within the first furnace tube to a next position for receiving a next substrate in the cassette disposed within the first furnace tube;
(e) repeating (a) through (d) until there is no next position for receiving the next substrate in the cassette disposed within the first furnace tube.

13. A method for thermally curing a substrate as recited in claim 12, further comprising:
heating a plurality of substrates disposed within the cassette in the first furnace tube to a desired temperature for a desired time to cure the film requiring thermal curing; and
indexing the cassette disposed within the first furnace tube to a first unload position.

14. A method for thermally curing a substrate as recited in claim 13, further comprising:
(a) transitioning the substrate from the cassette in the first unload position disposed within the first furnace tube to a cooling chamber, wherein the cooling chamber is oriented adjacent to and external to the first furnace tube;
(b) cooling the substrate in the cooling chamber;
(c) removing the cooled substrate from the cooling chamber;
(d) indexing the cassette disposed within the first furnace tube to a next unload position;
(e) repeating (a)–(d) until there is no next unload position in the first furnace tube.

15. A method for thermally curing a substrate as recited in claim 13, wherein the desired temperature is about 300° C.–500° C.

16. A method for thermally curing a substrate as recited in claim 15, further comprising:
(a) transitioning the next substrate to a first position for receiving the substrate in a cassette disposed within a second furnace tube, the transitioning being from the hot plate, wherein the hot plate is oriented external to and adjacent to the second furnace tube;
(b) indexing the cassette disposed within the second furnace tube to a next position for receiving another next substrate in the second furnace tube;
(c) repeating (a) through (b) until there is no next position for receiving the next substrate in the cassette disposed within the second furnace tube.

17. A method for thermally curing a substrate as recited in claim 16, further comprising:
heating a plurality of substrates disposed within the cassette in the second furnace tube to a desired temperature for a desired time to cure the film requiring thermal curing; and
indexing the cassette disposed within the second furnace tube to a first unload position in the second furnace tube.

18. A method for thermally curing a substrate as recited in claim 17, further comprising:
(a) transitioning the substrate from the first unload position in the cassette disposed within the second furnace tube to the cooling chamber, wherein the cooling chamber is oriented adjacent to and external to the second furnace tube;
(b) cooling the substrate in the cooling chamber;
(c) removing the cooled substrate from the cooling chamber;
(d) indexing the cassette to a next unload position in the second furnace tube;
(e) repeating (a)–(d) until there is no next unload position in the second furnace tube.

19. A method for thermally curing a substrate as recited in claim 18, wherein as substrates are being transitioned from the first furnace tube to the cooling chamber, substrates are being transitioned from the hot-plate to the second furnace tube, and as substrates are being transitioned from the second furnace tube to the cooling chamber, substrates are being transitioned from the hot-plate to the first furnace tube.

20. A cure furnace system, comprising:
a vertical furnace tube having a lower region, a middle region, and an upper region;

a hot-plate being oriented adjacent to and external to the vertical furnace tube and being in communication with a lower passageway, the lower passageway being connected between the vertical furnace tube in the lower region and the hot-plate;

a cooling chamber being oriented adjacent to and external to the vertical furnace tube and being in communication with the vertical furnace tube in the upper region; and a wafer transport configured to hold semiconductor wafers disposed within the vertical furnace tube, the wafer transport being configured to transition semiconductor wafers from the lower region of the vertical furnace tube to the upper region the vertical furnace tube.

21. A cure furnace system as recited in claim 20, wherein the wafer transport includes a semiconductor wafer cassette, and a semiconductor wafer rack.

22. A cure furnace system as recited in claim 21, wherein the cooling chamber is connected to the vertical furnace tube in the upper region with an upper passageway extending between the cooling chamber and the vertical furnace tube in the upper region, the upper passageway configured to seal the cooling chamber from the vertical furnace tube and from an outside ambient atmosphere.

23. A cure furnace system as recited in claim 22 wherein the cooling chamber is configured to receive cooled nitrogen to cool a semiconductor wafer.

24. A cure furnace system as recited in claim 22 wherein the cooling chamber is configured to receive cooled helium to cool a semiconductor wafer.

25. A cure furnace system as recited in claim 20, wherein the hot-plate is configured to pre-heat a semiconductor wafer.

26. A cure furnace system as recited in claim 20, further comprising a nitrogen pre-heater being configured to receive nitrogen and pre-heat the nitrogen to a desired temperature.

27. A cure furnace system as recited in claim 26, wherein the pre-heated nitrogen is supplied to the lower region of the vertical furnace tube, the vertical furnace tube being configured to receive pre-heated nitrogen in the lower region and flow the pre-heated nitrogen from the lower region to the upper region.

28. A cure furnace system as recited in claim 20, wherein the vertical furnace tube is configured to maintain at least one thermal zone in the middle region, the at least one thermal zone being at a desired temperature to thermally cure the semiconductor wafers in the wafer transport.

29. A cure furnace system as recited in claim 20, wherein the vertical furnace tube is configured to maintain a plurality of thermal zones in the middle region, the plurality of thermal zones being at desired temperatures to thermally cure films on the semiconductor wafers in the transport.

30. A cure furnace system, comprising:

a pair of vertical furnace tubes, each one of the pair of vertical furnace tubes having a lower region, a middle region, and an upper region;

a hot-plate being oriented adjacent to and external to each of the pair of vertical furnace tubes and being in communication with a lower passageway, the lower passageway being connected to each one of the pair of vertical furnace tubes in the lower region;

a cooling chamber being oriented adjacent to and external to each of the pair of vertical furnace tubes and being in communication with each one of the pair of vertical furnace tubes in an upper region; and a wafer cassette configured to hold substrates disposed within each one of the pair of vertical furnace tubes, the wafer cassette being configured to transition substrates from the lower region of each one of the pair of vertical furnace tubes to an upper region of each one of the pair of vertical furnace tubes.

31. A cure furnace system as recited in claim 30, wherein the cooling chamber is connected to each of the pair of vertical furnace tubes in an upper region with an upper passageway extending between each of the pair of vertical furnace tubes in the upper region, the upper passageway configured to seal the cooling chamber from each of the pair of vertical furnace tubes and from an outside ambient atmosphere.

32. A cure furnace system as recited in claim 31, wherein the cooling chamber is configured to receive cooled nitrogen to cool a substrate.

33. A cure furnace system as recited in claim 31, wherein the cooling chamber is configured to receive cooled helium to cool a substrate.

34. A cure furnace system as recited in claim 30, wherein the hot-plate is configured to pre-heat a substrate.

35. A cure furnace system as recited in claim 30, further comprising a nitrogen pre-heater being configured to receive nitrogen and pre-heat the nitrogen to a desired temperature.

36. A cure furnace system as recited in claim 35, wherein the pre-heated nitrogen is supplied to the lower region of each of the pair of vertical furnace tubes, each of the pair of vertical furnace tubes being configured to receive pre-heated nitrogen in the lower region and flow the pre-heated nitrogen from the lower region to the upper region.

37. A cure furnace system as recited in claim 30, wherein each of the pair of vertical furnace tubes is configured to maintain at least one thermal zone in the middle region, the at least one thermal zone being at a desired temperature to thermally cure films on the substrates in the cassette.

38. A cure furnace system as recited in claim 37, wherein each of the pair of vertical furnace tubes is configured to maintain a plurality of thermal zones in the middle region, the plurality of thermal zones being at desired temperatures to thermally cure films on the substrates in the wafer cassette.

39. A cure furnace system as recited in claim 38, wherein the temperature of the thermal zone is between about 300° C. and 500° C., and the films on the-substrates are low k dielectric films.

* * * * *